United States Patent
Trinh et al.

(10) Patent No.: US 11,362,271 B2
(45) Date of Patent: *Jun. 14, 2022

(54) SWITCHING LAYER SCHEME TO ENHANCE RRAM PERFORMANCE

(71) Applicant: Taiwan Semiconductor Manufacturing Co., Ltd., Hsinchu (TW)

(72) Inventors: Hai-Dang Trinh, Hsinchu (TW); Cheng-Yuan Tsai, Chu-Pei (TW); Hsing-Lien Lin, Hsin-Chu (TW); Wen-Ting Chu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 17 days.

This patent is subject to a terminal disclaimer.

(21) Appl. No.: 17/022,413

(22) Filed: Sep. 16, 2020

(65) Prior Publication Data
US 2020/0411756 A1 Dec. 31, 2020

Related U.S. Application Data

(63) Continuation of application No. 16/655,478, filed on Oct. 17, 2019, now Pat. No. 10,811,600, which is a (Continued)

(51) Int. Cl.
*H01L 45/00* (2006.01)
*G06F 12/02* (2006.01)
*H01L 27/24* (2006.01)

(52) U.S. Cl.
CPC .......... *H01L 45/12* (2013.01); *G06F 12/0246* (2013.01); *H01L 45/08* (2013.01); *H01L 45/1233* (2013.01); *H01L 45/14* (2013.01); *H01L 45/146* (2013.01); *H01L 45/147* (2013.01); *H01L 45/1608* (2013.01); *H01L 45/1666* (2013.01); *H01L 45/1675* (2013.01); *H01L 27/2436* (2013.01); *H01L 45/145* (2013.01)

(58) Field of Classification Search
CPC ... H01L 45/145; H01L 45/146; H01L 45/147; H01L 45/1233
See application file for complete search history.

(56) References Cited

U.S. PATENT DOCUMENTS

| | | |
|---|---|---|
| 9,172,036 B2 | 10/2015 | Chen et al. |
| 9,425,392 B2 | 8/2016 | Chang et al. |

(Continued)

OTHER PUBLICATIONS

Notice of Allowance dated Sep. 14, 2018 for U.S. Appl. No. 15/633,101.
(Continued)

*Primary Examiner* — Nicholas J Tobergte
(74) *Attorney, Agent, or Firm* — Eschweiler & Potashnik, LLC

(57) ABSTRACT

The present disclosure relates to a memory device. The memory device includes a first electrode over a substrate and a second electrode over the substrate. A data storage structure is disposed between the first electrode and the second electrode. The data storage structure includes one or more metals having non-zero concentrations that change as a distance from the substrate increases.

20 Claims, 10 Drawing Sheets

Related U.S. Application Data continuation of application No. 16/211,723, filed on Dec. 6, 2018, now Pat. No. 10,505,107, which is a continuation of application No. 15/633,101, filed on Jun. 26, 2017, now Pat. No. 10,164,182.

(56) References Cited

U.S. PATENT DOCUMENTS

| | | | | |
|---|---|---|---|---|
| 9,431,609 | B2* | 8/2016 | Dang | H01L 45/147 |
| 9,461,245 | B1* | 10/2016 | Yang | H01L 45/1233 |
| 9,647,207 | B2 | 5/2017 | Trinh et al. | |
| 10,164,182 | B1 | 12/2018 | Trinh et al. | |
| 10,505,107 | B2 | 12/2019 | Trinh et al. | |
| 10,811,600 | B2* | 10/2020 | Trinh | H01L 45/1233 |
| 2015/0194602 | A1 | 7/2015 | Liao et al. | |
| 2017/0077310 | A1* | 3/2017 | Oda | H01L 29/66757 |
| 2017/0141300 | A1* | 5/2017 | Trinh | H01L 45/1233 |
| 2018/0012657 | A1* | 1/2018 | Shih | G11C 13/003 |
| 2018/0204845 | A1* | 7/2018 | Zhang | G11C 17/165 |

OTHER PUBLICATIONS

Non-Final Office Action dated May 28, 2019 for U.S. Appl. No. 16/211,723.
Notice of Allowance dated Aug. 26, 2019 for U.S. Appl. No. 16/211,723.
Non-Final Office Action dated Mar. 16, 2020 for U.S. Appl. No. 16/655,478.
Notice of Allowance dated Jun. 22, 2020 for U.S. Appl. No. 16/655,478.

* cited by examiner

SWITCHING LAYER SCHEME TO ENHANCE RRAM PERFORMANCE

REFERENCE TO RELATED APPLICATIONS

This application is a Continuation of U.S. application Ser. No. 16/655,478, filed on Oct. 17, 2019, which is a Continuation of U.S. application Ser. No. 16/211,723, filed on Dec. 6, 2018 (now U.S. Pat. No. 10,505,107, issued on Dec. 10, 2019), which is a Continuation of U.S. application Ser. No. 15/633,101, filed on Jun. 26, 2017 (now U.S. Pat. No. 10,164,182, issued on Dec. 25, 2018). The contents of the above-referenced patent applications are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random access memory (RRAM) is one promising candidate for next generation non-volatile memory technology due to its simple structure and its compatibility with CMOS logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
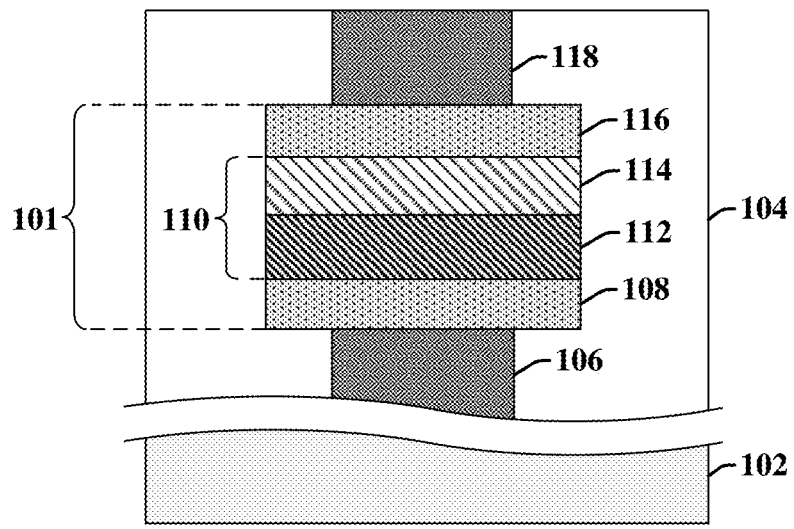
FIG. 1 illustrates a cross-sectional view of some embodiments of a resistive random access memory (RRAM) device having a multi-layer data storage structure configured to provide a good balance of endurance and data retention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) devices are configured to store data by switching between different resistive values corresponding to different data states. To enable such 'resistive switching,' RRAM devices have a lower electrode that is separated from an upper electrode by a data storage layer having a variable resistance. Resistive switching allows for an RRAM device to change an electrical resistance of the data storage layer between a high resistive state corresponding to a first data state (e.g., a "0") and a low resistive state corresponding to a second data state (e.g., a "1").

The data storage layer typically comprises a high-k dielectric material that is able to alter its internal resistance in response to an applied bias. There are a wide range of high-k dielectric materials that are currently used in RRAM devices. Different high-k dielectric materials provide RRAM devices with different characteristics. For example, some high-k dielectric materials may offer good endurance, while other high-k dielectric materials may offer good data retention. However, it has been appreciated that most high-k dielectric materials fail to offer both good endurance and data retention.

The present disclosure relates to an RRAM device having a multi-layer dielectric data structure configured to provide for good endurance and data retention, and an associated method of formation. In some embodiments, the RRAM device comprises a lower electrode disposed over a lower interconnect layer surrounded by a lower inter-level dielectric layer. An upper electrode is disposed over the lower electrode and a multi-layer data storage structure is between the lower and upper electrodes. The multi-layer data storage structure has first and second sub-layers. The first sub-layer has a first metal from a first group of metals, a first concentration of a second metal from a second group of metals, and oxygen. The second sub-layer has a third metal from the first group of metals, a non-zero second concentration of a fourth metal from the second group of metals, and oxygen. The non-zero second concentration is smaller than the first concentration and causes conductive filaments formed within the second sub-layer to be wider than conductive filaments formed within the first sub-layer. The widths of conductive filaments within the different sub-layers allow the multi-layer data storage structure to provide an RRAM device with a good balance of endurance and data retention.

FIG. 1 illustrates a cross-sectional view of some embodiments of an integrated chip 100 comprising a resistive random access memory (RRAM) device having a multi-layer data storage structure configured to provide a good balance of endurance and data retention.

The integrated chip 100 comprises an RRAM device 101 surrounded by an inter-level dielectric (ILD) structure 104 arranged over a substrate 102. The RRAM device 101 comprises a lower electrode 108, a multi-layer data storage structure 110, and an upper electrode 116. The lower electrode 108 is separated from the substrate 102 by one or more lower interconnect layers 106 (e.g., a metal via and/or a metal wire). The multi-layer data storage structure 110 is arranged over the lower electrode 108. The upper electrode 116 is disposed between the multi-layer data storage structure 110 and an upper interconnect layer 118 (e.g., a metal via and/or a metal wire).

The multi-layer data storage structure 110 is configured to store data states by undergoing reversible changes between a high resistance state associated with a first data state (e.g., a '0') and a low resistance state associated with a second data state (e.g., a '1'). For example, to achieve a low resistance state within the multi-layer data storage structure 110, a first set of bias conditions may be applied to the lower electrode 108 and the upper electrode 116. The first set of bias conditions may drive oxygen from the multi-layer data storage structure 110 to the upper electrode 116, thereby forming conductive filaments of oxygen vacancies across the multi-layer data storage structure 110. Alternatively, to achieve a high resistance state within the multi-layer data storage structure 110, a second set of bias conditions may be applied to the lower electrode 108 and the upper electrode 116. The second set of bias conditions may break the conductive filaments by driving oxygen from the upper electrode 116 to the multi-layer data storage structure 110.

The multi-layer data storage structure 110 comprises a plurality of sub-layers 112-114, respectively having a metal from a first group of metals (A), a metal from a second group of metals (B) different than the first group of metals (A), and oxygen (O). In some embodiments, metals within the first group of metals (A) are not in the second group of metals (B), and vice versa. The plurality of sub-layers 112-114 have concentrations of the metal(s) from the second group of metals that change as a distance from the lower electrode 108 changes (i.e., the plurality of sub-layers 112-114 respectively comprise ABO, with different concentrations of B that change as a distance from the lower electrode 108 changes). In some embodiments, the concentrations of a metal from the second group of metals within a sub-layer may be proportional to a density of oxygen vacancies within the sub-layer (e.g., a first sub-layer 112 having a first concentration of a metal from the second group of metals may have a higher oxygen vacancy density than a second sub-layer 224 having a second concentration of a metal from the second group of metals that is less than the first concentration).

In some embodiments, the plurality of sub-layers 112-114 have concentrations of the metal(s) from the second group of metals that decrease as a distance from the lower electrode 108 increases. For example, the multi-layer data storage structure may comprise a first sub-layer 112 and a second sub-layer 114 over the first sub-layer 112. The first sub-layer 112 has a first metal from the first group of metals, a first concentration of a second metal from the second group of metals, and oxygen. The second sub-layer 114 has a third metal from the first group of metals, a non-zero second concentration of a fourth metal from the second group of metals, and oxygen, wherein the non-zero second concentration is less than the first concentration. In some embodiments, the first metal may comprise a same element as the third metal and the second metal may comprise a same element as the fourth metal. In other embodiments, the first metal may comprise a different element than the third metal and the second metal may comprise a different element than the fourth metal.

Because the non-zero second concentration is smaller than the first concentration, relatively narrow conductive filaments (e.g., resulting from a high vacancy density) may be formed within the first sub-layer 112, while wider conductive filaments may be formed within the second sub-layer 114. The relatively narrow conductive filaments within the first sub-layer 112 provide for good data retention but relatively poor endurance, while the wider conductive filaments within the second sub-layer 114 provide for good endurance but relatively poor data retention. Accordingly, by using multiple sub-layers with different concentrations of the metal(s) from the second group of metals, the multi-layer data storage structure 110 is able to provide the RRAM device 101 with a good balance of endurance and data retention.

Figure 2:
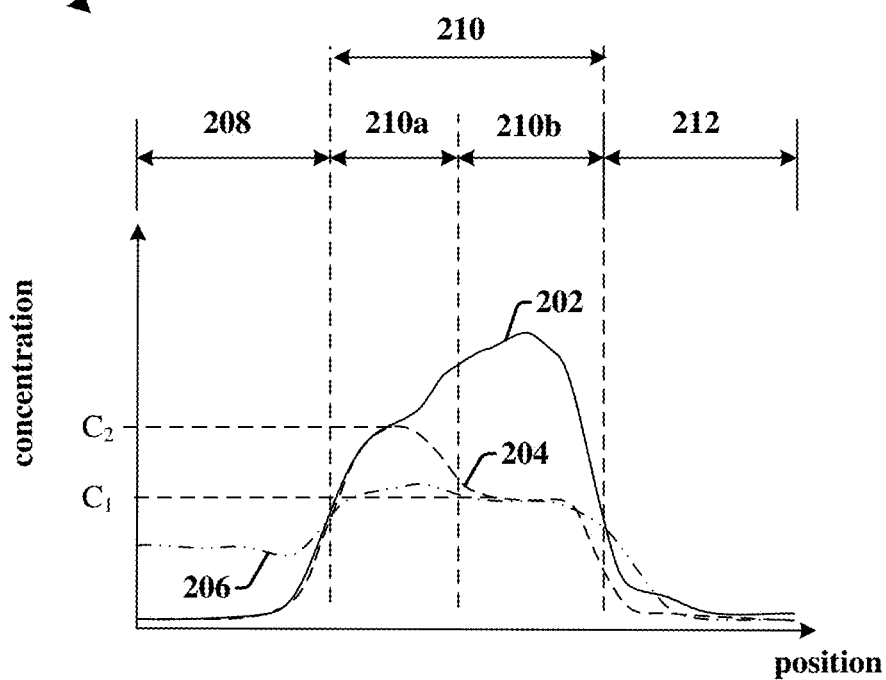
FIG. 2 illustrates a graph of some embodiments showing metal and oxygen concentrations within a multi-layer data storage structure of an RRAM device as a function of position.

FIG. 2 illustrates a graph 200 showing some embodiments of metal and oxygen concentrations within a multi-layer data storage structure of an RRAM device as a function of position. The graph 200 illustrates a position within the RRAM device along the x-axis. The graph also illustrates a concentration of a first metal 202 from a first group of metals, a concentration of a second metal 204 from a second group of metals, and an oxygen concentration 206 along the y-axis.

As shown in graph 200, the concentration of the first metal 202 and the concentration of the second metal 204 are larger within a second region 210 corresponding to a multi-layer data storage structure (e.g., multi-layer data storage structure 110 of FIG. 1) than within a first region 208 corresponding to a lower electrode (e.g., lower electrode 108 of FIG. 1) or a third region 212 corresponding to an upper electrode (e.g., upper electrode 116 of FIG. 1). Within the second region 210, the concentration of the second metal 204 within a first sub-region 210a corresponding to a first sub-layer (e.g., first sub-layer 112 of FIG. 1) has a peak value $C_1$ that is larger than a peak value $C_2$ of the concentration of the second metal 204 within a second sub-region 210b corresponding to a second sub-layer (e.g., second sub-layer 114 of FIG. 1). In some embodiments, the concentration of the first metal 202 may be larger within the second sub-region 210b than within the first sub-region 210a.

In some embodiments, the concentration of the second metal 204 within the first sub-region 210a may be in a first range of between approximately 50% and approximately 100%. In some additional embodiments, the concentration of the second metal 204 within the first sub-region 210a may be in a first range of between approximately 50% and approximately 80%. In some embodiments, the concentration of the second metal 204 within the second sub-region 210b may be in a second range of between approximately 30% and approximately 60%. In some additional embodiments, the concentration of the second metal 204 within the second sub-region 210b may be in a second range of between approximately 50% and approximately 60%.

Figure 3A:
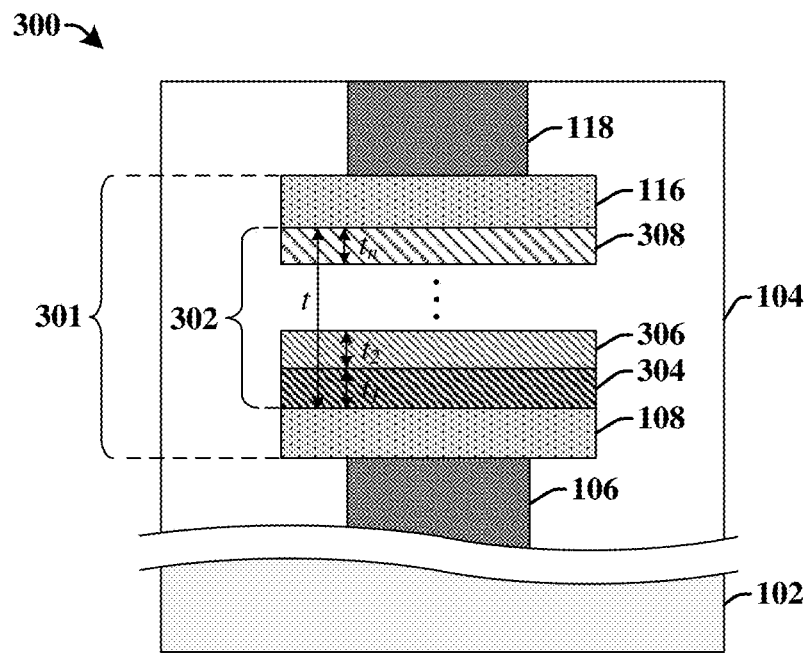
FIGS. 3A-3B illustrates some additional embodiments of an integrated chip comprising an RRAM device having a multi-layer data storage structure.
Figure 3B:
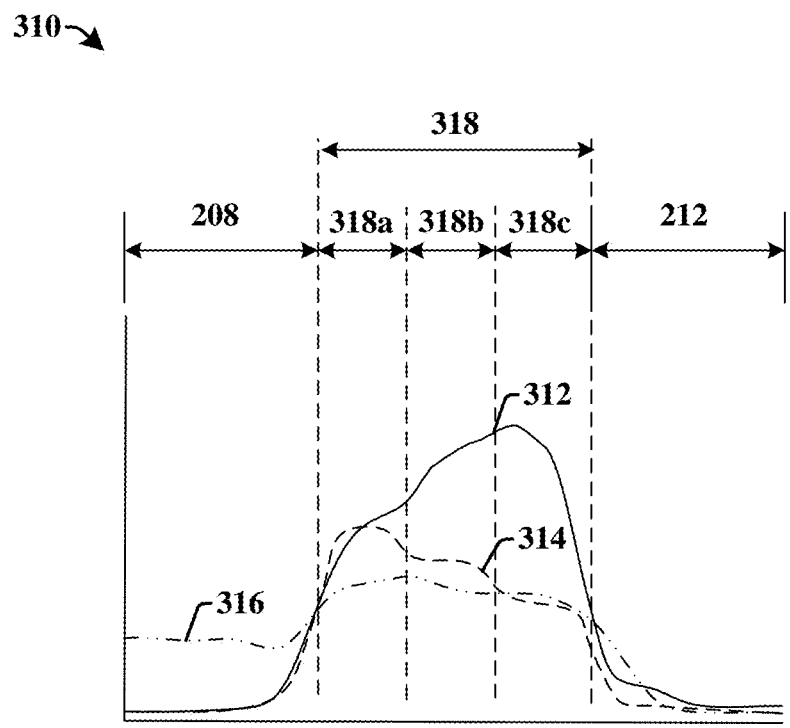

FIGS. 3A-3B illustrates some additional embodiments of an integrated chip 300 comprising an RRAM device having a multi-layer data storage structure.

The integrated chip 300 comprises an RRAM device 301 having a multi-layer data storage structure 302 comprising a plurality of sub-layers 304-308 arranged between a lower electrode 108 and an upper electrode 116. The multi-layer data storage structure 302 comprises a first sub-layer 304, a second sub-layer 306 arranged over the first sub-layer 304, and a third sub-layer 308 arranged over the second sub-layer 306. The first sub-layer 304, the second sub-layer 306, and the third sub-layer 308 respectively comprise a metal from a first group of metals, a metal from a second group of metals, and oxygen. The first sub-layer 304 has a first concentration of a metal from the second group of metals, the second sub-layer 306 has a second concentration of a metal from the second group of metals that is less than the first concentration, and the third sub-layer 308 has a third concentration of a metal from the second group of metals that is less than the second concentration.

In some embodiments, the metal from the first group of metals within the first sub-layer 304 is a same element as the metal from the first group of metals within the second sub-layer 306 and the third sub-layer 308. Similarly, the metal from the second group of metals within the first sub-layer 304 may be a same element as the metal from the second group of metals within the second sub-layer 306 and the third sub-layer 308. Alternatively, the metal from the first group of metals within the first sub-layer 304 may be a different element than the metal from the first group of metals within the second sub-layer 306 and/or the third sub-layer 308. Similarly, the metal from the second group of metals within the first sub-layer 304 may be a different element than the metal from the second group of metals within the second sub-layer 306 and/or the third sub-layer 308.

In some embodiments, one or more additional sub-layers (not shown) may be arranged between the second sub-layer 306 and the third sub-layer 308. The one or more or additional sub-layers have concentrations of a metal from the second group of metals that are between the second concentration and the third concentration, and that decrease as a distance from the second sub-layer 306 increases.

In some embodiments, the multi-layer data storage structure 302 may have a thickness t in a range of between approximately 20 angstroms and approximately 100 angstroms. In some embodiments, the plurality of sub-layers 304-308 may have thicknesses ($t_1$ ... $t_n$) in a range of between approximately 5 angstroms and approximately 50 angstroms.

FIG. 3B illustrates some embodiments of a graph 310 showing metal and oxygen concentrations within the RRAM device 301 as a function of position. The graph 310 illustrates a position within the RRAM device along the x-axis. The graph 310 also illustrates a concentration of a first metal 312 from a first group of metals, a concentration of a second metal 314 from a second group of metals, and an oxygen concentration 316 along the y-axis.

As shown in graph 310, within a second region 318 corresponding to the multi-layer data storage structure 302, the concentration of the second metal 314 is larger within a first sub-region 318a than within a second sub-region 318b, and the concentration of the second metal 314 is larger within the second sub-region 318b than within a third sub-region 318c.

Figure 4:
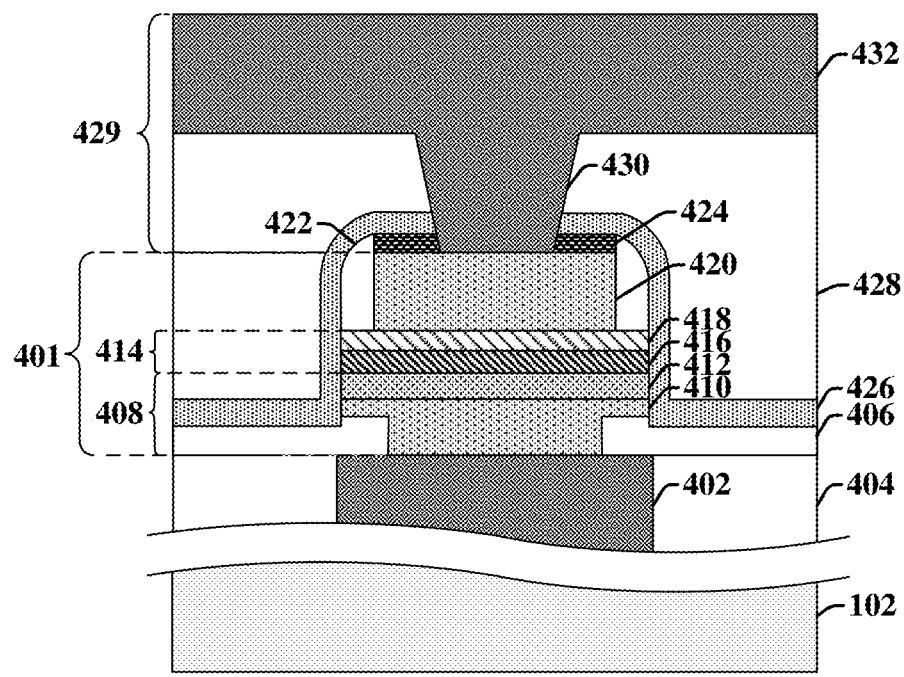
FIG. 4 illustrates a cross-sectional view of some additional embodiments of an integrated chip comprising an RRAM device having a multi-layer data storage structure.

FIG. 4 illustrates a cross-sectional view of some additional embodiments of an integrated chip 400 comprising an RRAM device having a multi-layer data storage structure.

The integrated chip 400 comprises an RRAM device 401 arranged over a lower interconnect layer 402. The lower interconnect layer 402 is surrounded by a lower inter-level dielectric (ILD) layer 404. In some embodiments, the lower interconnect layer 402 may comprise one of a plurality of interconnect layers (e.g., metal wires, vias, etc.) disposed between the RRAM device 401 and a substrate 102. The lower interconnect layer 402 may comprise a conductive metal such as copper, aluminum, and/or tungsten, for example. A lower dielectric layer 406 is located over opposing sides of the lower interconnect layer 402.

The RRAM device 401 comprises a lower electrode 408, a multi-layer data storage structure 414 having a variable resistance, and an upper electrode 420. The lower electrode 408 extends from over the lower dielectric layer 406 to the lower interconnect layer 402. In some embodiments, the lower electrode 408 may comprise a first lower electrode layer 410 and a second lower electrode layer 412 arranged over the first lower electrode layer 410. In some embodiments, the lower electrode 408 and the upper electrode 420 may comprise a metal, such as tantalum (Ta) and/or titanium (Ti) and/or TiN and/or TaN. In some embodiments, the first lower electrode layer 410 may comprise a diffusion barrier layer (e.g., tantalum nitride) while the second lower electrode layer 412 may comprise a metal (e.g., titanium, titanium nitride).

The multi-layer data storage structure 414 is located over the lower electrode 408. In some embodiments, the multi-layer data storage structure 414 may directly contact the lower electrode 408. The multi-layer data storage structure 414 comprises a plurality of sub-layers 416-418. The plurality of sub-layers 416-418 respectively have a metal from a first group of metals, a metal from a second group of metals, and oxygen. In some embodiments, the first group of metals may comprise titanium, hafnium, and zirconium, and the second group of metals may comprise aluminum, tantalum, vanadium, yttrium, and lanthanum. In some such embodiments, the first sub-layer 416 may comprise titanium aluminum oxide, hafnium tantalum oxide, or zirconium lanthanum oxide and the second sub-layer 418 may comprise titanium aluminum oxide, hafnium tantalum oxide, or zirconium lanthanum oxide, for example.

The plurality of sub-layers 416-418 have concentrations of one or more metals from the second group of metals that change (e.g., decreases) as a distance form the lower electrode 480 changes (e.g., increases). For example, in some embodiments, the plurality of sub-layers 416-418 comprise a first sub-layer 416 having a first concentration of a metal from the second group of metals and a second sub-layer 418 having a second concentration of a metal from the second group of metals. The first concentration is configured to cause relatively narrow conductive filaments to form within the first sub-layer 416 (e.g., due to high vacancy density within the first sub-layer 416) that provide the RRAM device 401 with good data retention (e.g., a good switching window, less tailing), while the second concentration configured to cause wider conductive filaments to form within the second sub-layer 418 that provide the RRAM device 401 with good endurance (e.g., less failure bits during cycling).

In some embodiments, the concentration of the metal(s) from the second group of metals may be substantially constant within respective ones of the plurality of sub-layers 416-418. In such embodiments, the concentration of the metal(s) from the second group of metals within the plurality of sub-layers 416-418 may decrease in a step-wise manner as a distance from the lower electrode 408 increases. In other embodiments, the concentration of the metal(s) from the second group of metals may have a gradient concentration within respective ones of the plurality of sub-layers 416-418. In some embodiments, the gradient concentration of the metal(s) from the second group of metals within the plurality of sub-layers 416-418 may be separated in a step-wise manner. In other embodiments, the gradient concentration of the metal(s) from the second group of metals within the plurality of sub-layers 416-418 may be defined by a piece-wise continuous function.

In some embodiments, the plurality of sub-layers 416-418 may be of a same material. For example, the plurality of sub-layers 416-418 may comprise a plurality of layers of titanium aluminum oxide having different concentrations of aluminum. In other embodiments, the plurality of sub-layers 416-418 may comprise different materials. For example, the plurality of sub-layers may comprise a first sub-layer of titanium aluminum oxide and a second sub-layer of hafnium tantalum oxide. In such embodiments, the concentrations of the metal(s) from the second group of metals (e.g., aluminum and tantalum) within the plurality of sub-layers 416-418 decrease in a direction perpendicular to an upper surface of the lower electrode 408.

In some embodiments, a masking layer 424 may be disposed over the upper electrode 420. In some embodiments, the masking layer 424 may comprise a silicon oxy-nitride (SiON) hard mask layer, a silicon dioxide ($SiO_2$) hard mask layer, or a PE-SiN hard mask. In some embodiments, sidewall spacers 422 are disposed on opposing sides of the upper electrode 420 and the masking layer 424. An upper ILD layer 428 is disposed over the masking layer 424 at a position surrounding an upper interconnect structure 429 contacting the upper electrode 420. The upper interconnect structure 429 comprises an upper metal via 430, which extends through the masking layer 424 from the upper electrode 420 to an upper metal wire 432.

In some embodiments, an upper dielectric layer 426 is disposed over the RRAM device 401. The upper dielectric layer 426 continuously extends from a first position abutting a top surface of the masking layer 424 to a second position abutting an upper surface of the lower dielectric layer 406. The upper dielectric layer 426 separates the RRAM device 401 from the upper ILD layer 428. In some embodiments, the upper dielectric layer 426 may comprise a silicon nitride or a silicon oxide, for example.

Figure 5:
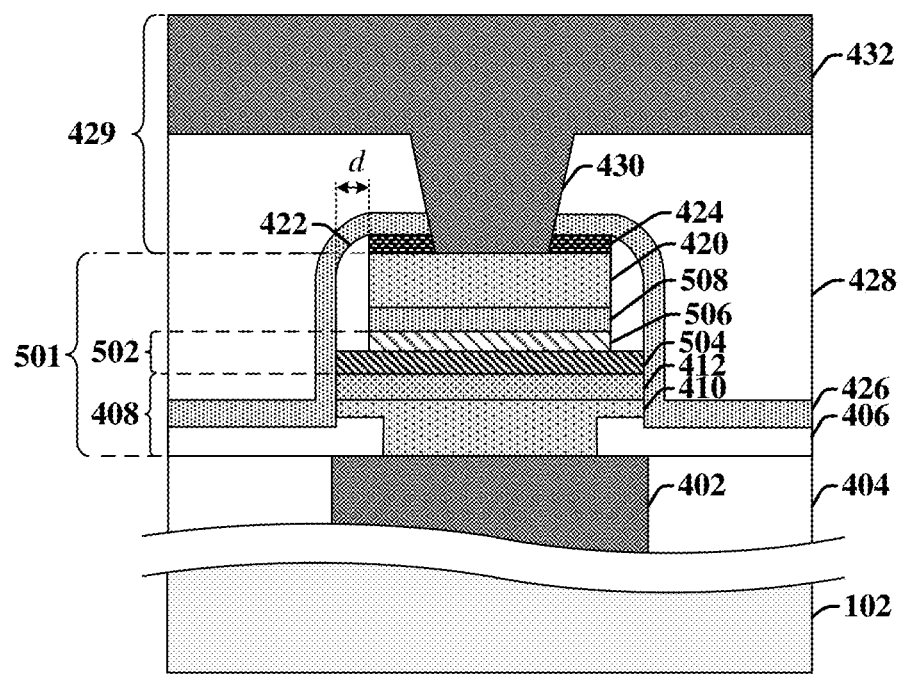
FIG. 5 illustrates a cross-sectional view of some additional embodiments of an integrated chip comprising an RRAM device having a multi-layer data storage structure.

FIG. 5 illustrates a cross-sectional view of some additional embodiments of an integrated chip 500 comprising an RRAM device having a multi-layer data storage structure.

The integrated chip 500 comprises an RRAM device 501 having a capping layer 508 arranged between a multi-layer data storage structure 502 and an upper electrode 420. The capping layer 508 is configured to store oxygen, which can facilitate resistance changes within the multi-layer data storage structure 502. In some embodiments, the capping layer 508 may comprise a metal or a metal oxide that is relatively low in oxygen concentration. For example, in some embodiments, the capping layer 508 may comprise a metal such as titanium (Ti), tantanium (Ta), zirconium (Zr), hafnium (Hf), platinum (Pt), and/or aluminum (Al). In other embodiments, the capping layer 508 may comprise a metal oxide such as titanium oxide (TiO), tantanium oxide (TaO), aluminum oxide (AlO), hafnium oxide (HfO), zirconium oxide (ZrO), germanium oxide (GeO), cesium oxide (CeO).

The multi-layer data storage structure 502 has a plurality of sub-layers 504-506 with concentrations of one or more metals from a second group of metals that decrease as a distance from the capping layer 508 decreases. For example, because the capping layer 508 is arranged over the multi-layer data storage structure 502, a first sub-layer 504 has a first concentration of a metal from the second group of metals that is greater than a second concentration of a metal from the second group of metals within the second sub-layer 506. In some embodiments, the capping layer 508 directly contacts one of the plurality of sub-layers 504-506 with a highest concentration of the metal from the second group of metals.

In some alternative embodiments, the capping layer 508 may be arranged between the lower electrode 408 and the multi-layer data storage structure 502. In such embodiments, because the capping layer 508 is arranged below the multi-layer data storage structure 502 and because the plurality of sub-layers have concentrations of the first metal that decrease as a distance from the capping layer decreases, the first sub-layer 502 has a first concentration of a metal from the second group of metals that is less than a second concentration of a metal from the second group of metals within the second sub-layer 504.

In some embodiments, the plurality of sub-layers 504-506 within the multi-layer data storage structure 502 may have outermost sidewalls that are laterally offset from one another. For example, in some embodiments, an uppermost one of the plurality of sub-layers 504-506 may have an outermost sidewall that is laterally set-back from an outermost sidewall of the multi-layer data storage structure 502 by a distance d.

Figure 6:
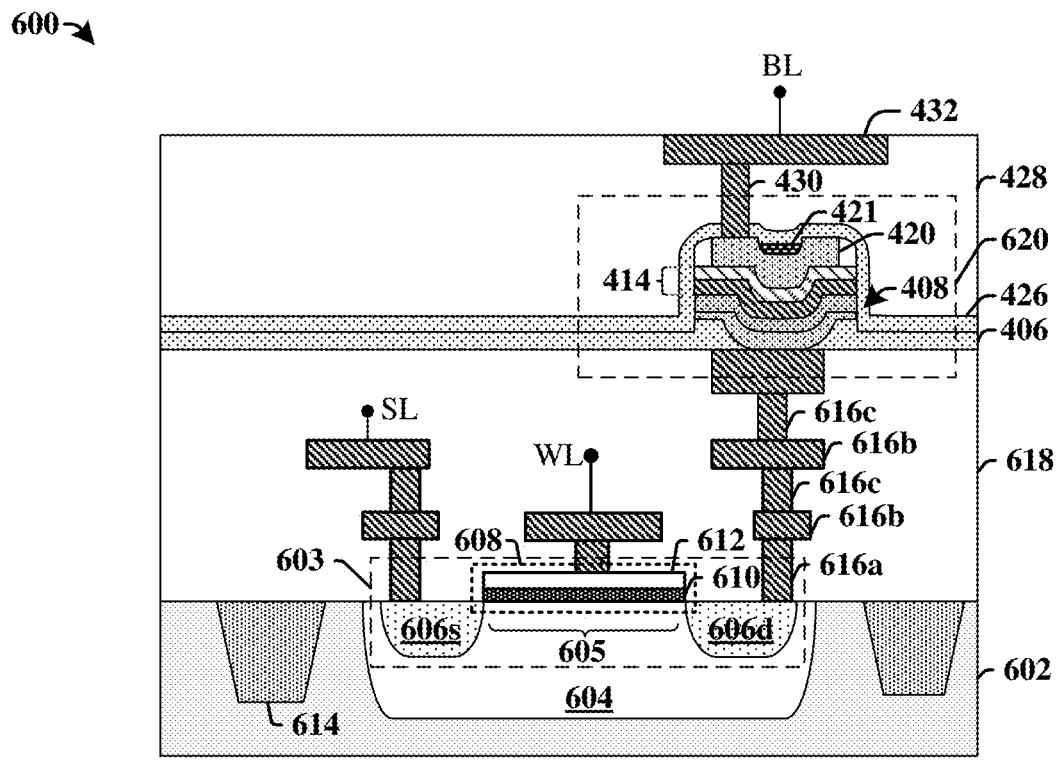
FIG. 6 illustrates a cross-sectional view of some embodiments of an integrated chip comprising an RRAM device having a multi-layer data storage structure.

FIG. 6 illustrates a cross-sectional view of some embodiments of an integrated chip 600 comprising an RRAM device having a multi-layer data storage structure.

The integrated chip 600 comprises a well region 604 disposed within a semiconductor substrate 602. A transistor 603 is arranged within the well region 604. The transistor 603 comprises a source region 606s that is separated from a drain region 606d by a channel region 605. A gate structure 608 is arranged over the channel region 605. The gate structure 608 comprises a gate electrode 612 separated from the channel region 605 by a gate dielectric layer 610. In some embodiments, the transistor 603 may be arranged between isolation regions 614 (e.g., shallow trench isolation regions) within the semiconductor substrate 602.

A first ILD structure 618 is arranged over the semiconductor substrate 602. In some embodiments, the first ILD structure 618 may comprise one or more layers of an oxide, a low-k dielectric, or an ultra low-k dielectric. A plurality of interconnect layers including contacts 616a, metal wire layers 616b, and metal via layers 616c are surrounded by the first ILD structure 618. In some embodiments, the plurality of contacts 616a, metal wire layers 616b, and metal via layers 616c may comprise copper, tungsten, and/or aluminum. The metal wire layers 616b comprise a source-line SL comprising a first interconnect wire that is electrically coupled to the source region 606s. In some embodiments, the source-line SL may be arranged in a second metal wire layer that is connected to the source region 606s through a contact, a first metal wire layer, and a first metal via layer. The metal wire layers 616b further comprise a word-line WL comprising a second interconnect wire that is electrically coupled to the gate electrode 612. In some embodiments, the word-line WL may be arranged in the first metal wire layer that is connected to the gate electrode 612 by way of a contact.

An RRAM device 620 is arranged over the first ILD structure 618. The RRAM device 620 comprises a lower electrode 408 that is vertically separated from the first ILD structure 618 by a lower dielectric layer 406. The lower electrode 408 is directly connected to the drain region 606d by the plurality of interconnect layers. The RRAM device 620 further comprises a multi-layer data storage structure 414 located over the lower electrode 408, and an upper electrode 420 disposed over the multi-layer data storage structure 414. The multi-layer data storage structure 414 comprises a plurality of sub-layers respectively having a metal from a first group of metals, a metal from a second group of metals, and oxygen. In some embodiments, the plurality of sub-layers have concentrations of one or more metals from the second group of metals that decrease as a distance from the lower electrode 408 increases.

In some embodiments, a recess may be disposed within an upper surface of the upper electrode 420 at a location directly over an opening within the lower dielectric layer 406. The recess may be filled with a blocking layer 421 (e.g., an antireflective layer). In some such embodiments, an upper metal via 430 contacts the upper surface of the upper electrode 420 at a location that is laterally offset from the recess.

FIGS. 7-17 illustrate some embodiments of cross-sectional views 700-1700 showing a method of forming an integrated chip comprising an RRAM device having a multi-layer data storage structure configured to provide a good balance of endurance and data retention. Although FIGS. 7-17 are described in relation to a method, it will be appreciated that the structures disclosed in FIGS. 7-17 are not limited to such a method, but instead may stand alone as structures independent of the method.

Figure 7:
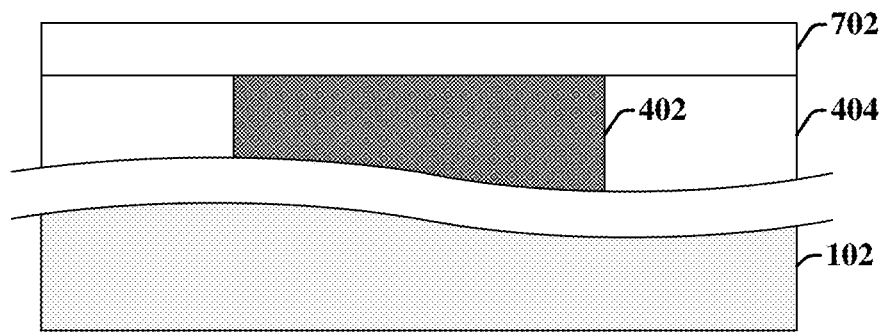
FIGS. 7-17 illustrate some embodiments of cross-sectional views showing a method of forming an integrated chip comprising an RRAM device having a multi-layer data storage structure.

As shown in cross-sectional view 700 of FIG. 7, a lower interconnect layer 402 is formed within a lower inter-level dielectric (ILD) layer 404 over a substrate 102. The substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the lower interconnect layer 402 may be formed by selectively etching the lower ILD layer 404 (e.g., an oxide, a low-k dielectric, or an ultra low-k dielectric) to define an opening within the lower ILD layer 404. A metal (e.g., copper, aluminum, etc.) is then deposited to fill the opening, and a planarization process (e.g., a chemical mechanical planarization process) is performed to remove excess metal.

A lower dielectric layer 702 is formed onto the lower interconnect layer 402 and the lower ILD layer 404. In some embodiments, the lower dielectric layer 702 may comprise silicon-nitride (SiN), silicon-carbide (SiC), or a similar composite dielectric film. In some embodiments, the lower dielectric layer 702 may be formed by a deposition technique (e.g., physical vapor deposition (PVD), chemical vapor deposition (CVD), PE-CVD, atomic layer deposition (ALD), sputtering, etc.) to a thickness in a range of between approximately 200 angstroms and approximately 300 angstroms.

Figure 8:
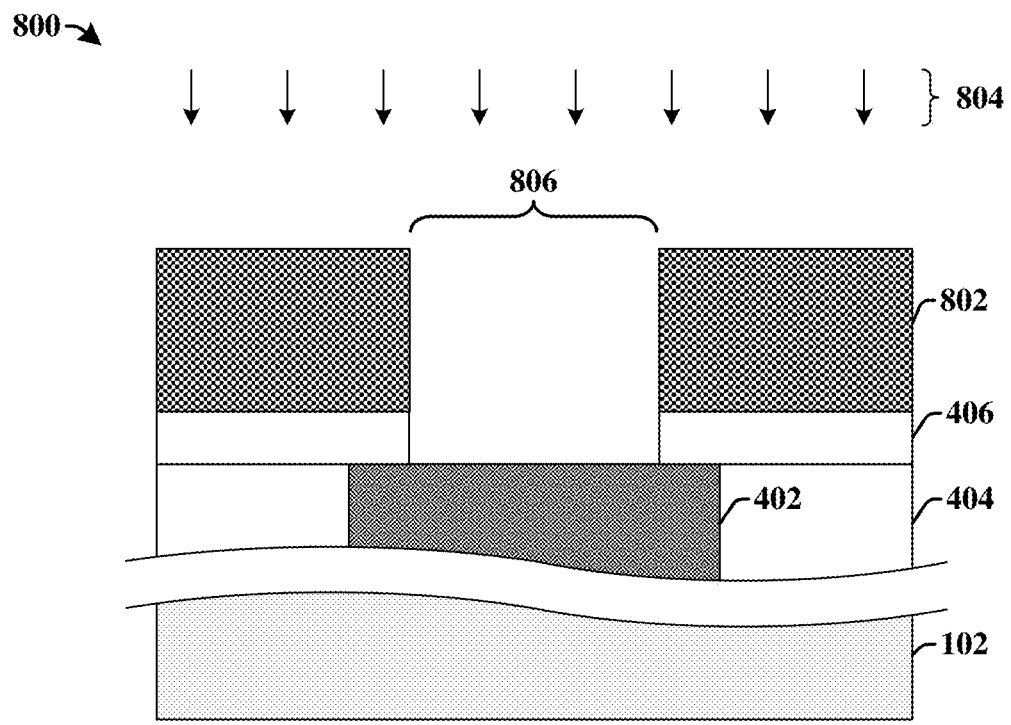

As shown in cross-sectional view 800 of FIG. 8, a first masking layer 802 is formed over the lower dielectric layer (702 of FIG. 7). The lower dielectric layer (702 of FIG. 7) is then selectively exposed to a first etchant 804 (e.g., a dry etchant) in areas not covered by the first masking layer 802. The first etchant 804 defines an opening 806 in the lower dielectric layer 406, which extends through the lower dielectric layer 406 to the lower interconnect layer 402.

Figure 9:
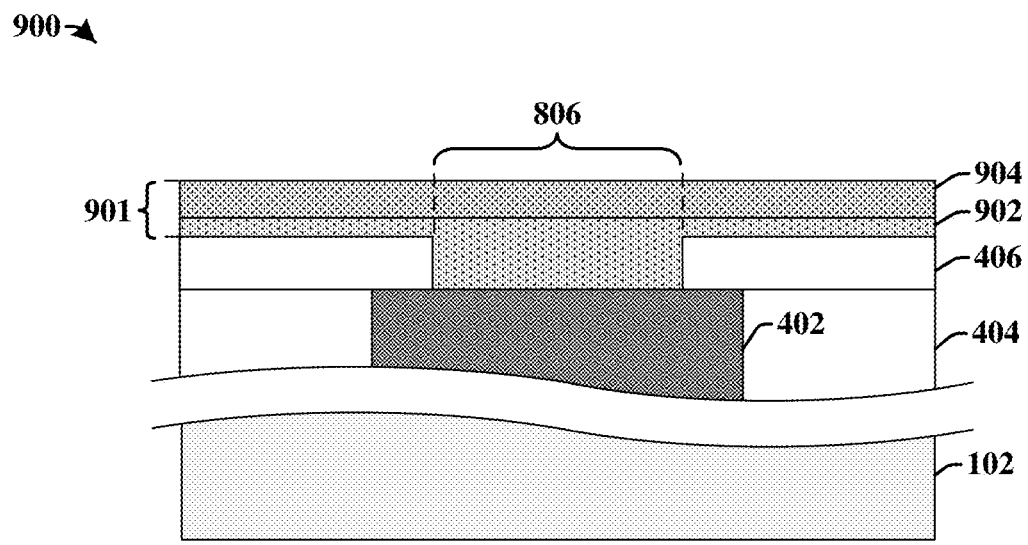

As shown in cross-sectional view 900 of FIG. 9, a lower electrode structure 901 is formed over the lower interconnect layer 402 and the lower dielectric layer 406. In some embodiments, the lower electrode structure 901 is formed by depositing one or more lower electrode films 902-904.

For example, the lower electrode structure 901 may be formed by depositing a first lower electrode film 902 and subsequently forming a second lower electrode film 904 over the first lower electrode film 902. The first lower electrode film 902 extends from within the opening 806 to a position overlying the lower dielectric layer 406. In some embodiments, the first lower electrode film 902 may comprise tantalum nitride (TaN) or titanium nitride (TiN), for example. A planarization process (e.g., a chemical mechanical planarization process) may subsequently be performed. In some embodiments, the planarization process results in the first lower electrode film 902 having a thickness in a range of between approximately 100 angstroms and approximately 300 angstroms over the lower dielectric layer 406. The second lower electrode film 904 is formed over the first lower electrode film 902. In some embodiments, the second lower electrode film 904 may comprise tantalum (Ta), titanium (Ti), titanium nitride (TiN), hafnium nitride (HfN), or tantalum nitride (TaN). In some embodiments, the second lower electrode film 904 may be formed to a thickness in a range of between approximately 100 angstroms and approximately 200 angstroms.

Figure 10:
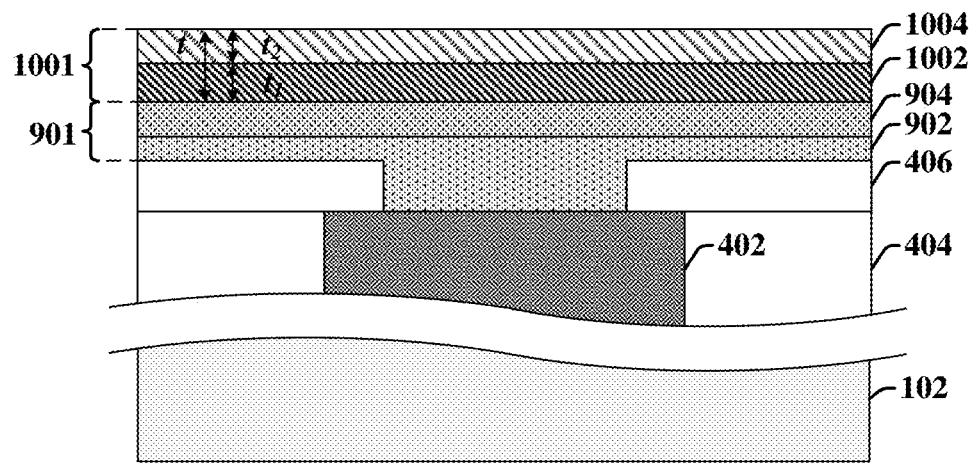

As shown in FIG. 10, a multi-layer data storage element 1001 is formed over the lower electrode structure 901. The multi-layer data storage element 1001 comprises a plurality of sub-layers 1002-1004. The plurality of sub-layers 1002-1004 respectively have a metal from a first group of metals, a metal from a second group of metals different than the first group of metals, and oxygen. In some embodiments, metals within the first group of metals are not within the second group of metals. The plurality of sub-layers 1002-1004 have concentrations of metals from the second group of metals that decrease in a direction perpendicular to an upper surface of the lower electrode structure 901.

Figure 11:
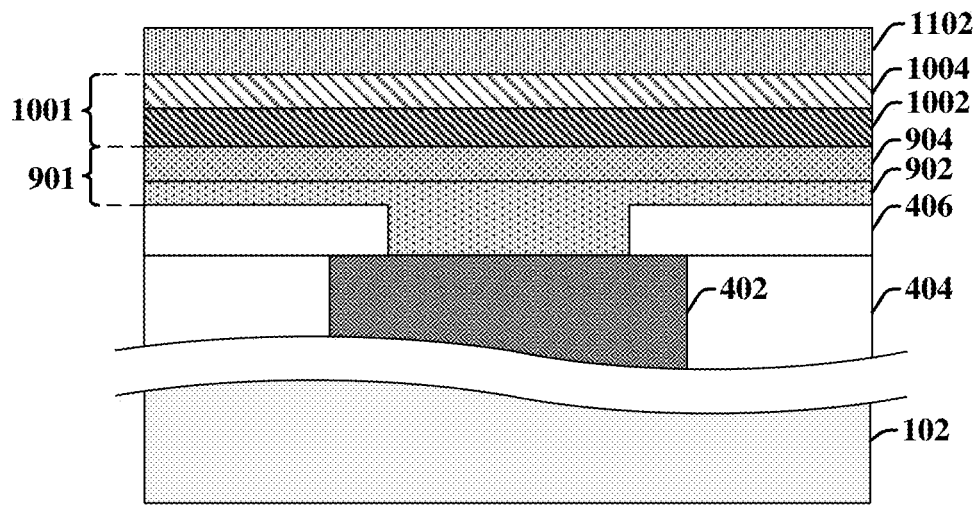

In some embodiments, the plurality of sub-layers 1002-1004 may have concentrations of the metal(s) from the second group of metals that decrease as a distance from a capping layer decreases. For example, in some embodiments wherein a capping layer is formed over the multi-layer data storage element 1001 (as shown in FIG. 11), the plurality of sub-layers 1002-1004 have concentrations of the metal(s) from the second group of metals that decrease as a distance from the lower electrode structure 901 increases. In other embodiments, wherein a capping layer is formed below the multi-layer data storage element 1001 (not shown), the plurality of sub-layers 1002-1004 have concentrations of the metal(s) from the second group of metals that decrease as a distance from the lower electrode structure 901 decreases.

In various embodiments, the multi-layer data storage element 1001 may comprise a bi-layer structure (i.e., having two sub-layers) or a multi-layer structure (i.e., having three or more sub-layers). For example, in some embodiments, the plurality of sub-layers 1002-1004 may comprise a first sub-layer 1002 formed over the lower electrode structure 901 and a second sub-layer 1004 formed over the first sub-layer 1002. The first sub-layer 1002 has a first metal from a first group of metals, a first concentration of a second metal from a second group of metals, and oxygen. The second sub-layer 1004 has a third metal from the first group of metals, a non-zero second concentration of a fourth metal from a second group of metals, and oxygen. In some embodiments, the first concentration may be in a first range of between approximately 50% and approximately 100%, and the second concentration is in a second range of between approximately 30% and approximately 60%.

In some embodiments, the first group of metals may comprise titanium, hafnium, and zirconium, and the second group of metals may comprise aluminum, tantalum, and lanthanum. In some such embodiments, the first sub-layer 1002 may comprise titanium aluminum oxide, hafnium tantalum oxide, or zirconium lanthanum oxide and the second sub-layer 1004 may comprise titanium aluminum oxide, hafnium tantalum oxide, or zirconium lanthanum oxide, for example.

In some embodiments, the plurality of sub-layers 1002-1004 may be a same material. For example, the plurality of sub-layers 1002-1004 may be layers of titanium aluminum oxide, wherein a concentration of aluminum decreases as a distance from a capping layer decreases. In other embodiments, the plurality of sub-layers 1002-1004 may be different materials. For example, the plurality of sub-layers may be a first sub-layer of titanium aluminum oxide and a second sub-layer of hafnium tantalum oxide, wherein concentrations of aluminum and tantalum decrease as a distance from a capping layer decreases.

The plurality of sub-layers 1002-1004 may be formed by way of a deposition technique (e.g., PVD, CVD, PE-CVD, sputtering, ALD, etc.). In some embodiments, the multi-layer data storage element 1001 may be formed to a thickness t in a range of between approximately 20 angstroms and approximately 100 angstroms. In some embodiments, the plurality of sub-layers 1002-1004 may be formed by separate deposition processes to thicknesses $t_1$-$t_2$ in a range of between approximately 5 angstroms and approximately 50 angstroms. In some embodiments, the plurality of sub-layers 1002-1004 may be deposited in-situ (e.g., without breaking a vacuum on a processing chamber).

As shown in cross-sectional view 1100 of FIG. 11, a capping film 1102 may be formed over the multi-layer data storage element 1001, in some embodiments. In various embodiments, the capping film 1102 may comprise titanium (Ti), tantalum (Ta), hafnium (Hf), aluminum (Al), or a similar material. In some alternative embodiments, the capping film 1102 may be formed prior to forming the multi-layer data storage element 1001, so that the capping film 1102 is between the lower electrode structure 901 and the multi-layer data storage element 1001. In some embodiments, the capping film 1102 may be formed by way of a deposition technique (e.g., PVD, CVD, PE-CVD, sputtering, ALD, etc.).

Figure 12:
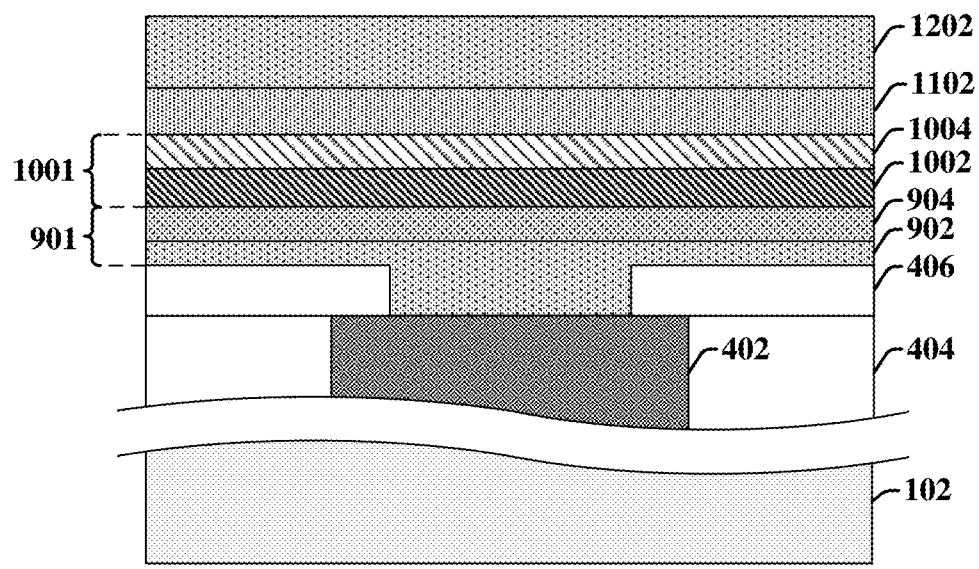

As shown in cross-sectional view 1200 of FIG. 12, an upper electrode film 1202 is formed over the multi-layer data storage element 1001. In some embodiments, the upper electrode film 1202 may comprise a metal, such as titanium (Ti) and/or tantalum (Ta). In some embodiments, the upper electrode film 1202 may be formed by way of a deposition technique (e.g., PVD, CVD, PE-CVD, sputtering, ALD, etc.).

Figure 13:
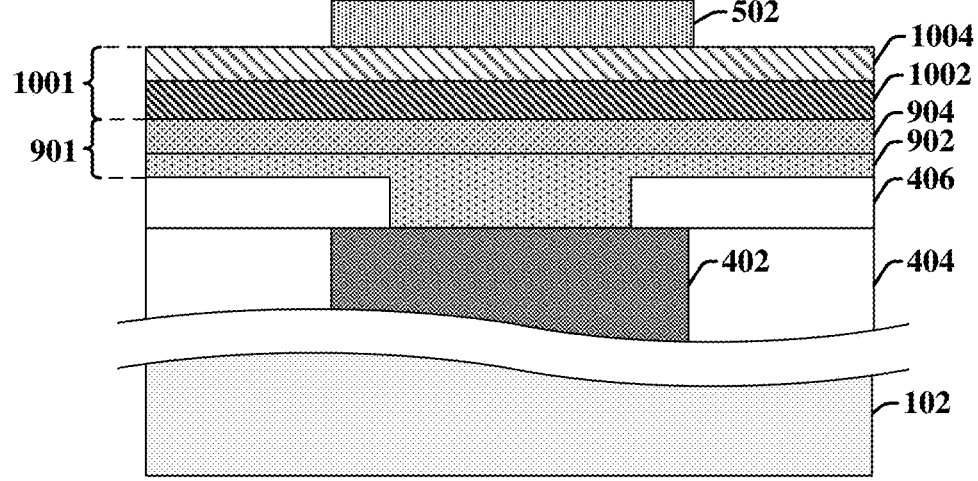

As shown in cross-sectional view 1300 of FIG. 13, a first patterning process is performed on the upper electrode film (1202 of FIG. 12). In some embodiments, the first patterning process comprises forming a masking layer 1304 over the upper electrode film (1202 of FIG. 12), and subsequently exposing the upper electrode film (1202 of FIG. 12) to a second etchant 1302 configured to define the upper electrode 420 by selectively removing unmasked parts of the upper electrode film (1202 of FIG. 12). In some embodiments, the second etchant 1302 may also remove unmasked parts of the capping film 1102.

In various embodiments, the second etchant 1302 may comprise a dry etchant having an etching chemistry comprising a fluorine species (e.g., $CF_4$, $CHF_3$, $C_4F_8$, etc.) or a wet etchant comprising hydroflouric acid (HF). In some embodiments, the first patterning process may reduce a thickness of the masking layer 1304. For example, in some embodiments, the first patterning process may reduce a thickness of the masking layer 1304 by a range of between approximately 70% and approximately 85% (e.g., from approximately 550 angstroms to approximately 100 angstroms).

In some embodiments, over-etching of the upper electrode film (1202 of FIG. 12) may cause a part of the multi-layer data storage element 1001 to be etched. For example, in some embodiments, a part of the second sub-layer 1004 may be etched away so that the second sub-layer 1004 has a sidewall that is laterally set-back from an outermost sidewall of the multi-layer data storage element 1001 (e.g., from an outermost sidewall of the first sub-layer 1002).

Figure 14:
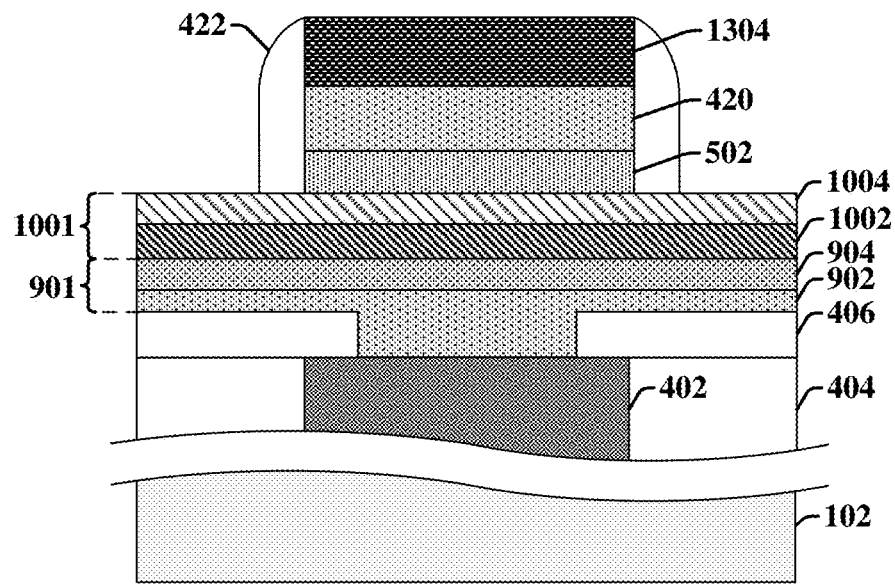

As shown in cross-sectional view 1400 of FIG. 14, sidewall spacers 422 may be formed on opposing sides of the upper electrode 420. In some embodiments, the sidewall spacers 422 may be formed by depositing a spacer layer over the substrate 102 using a deposition technique (e.g., PVD, CVD, PE-CVD, ALD, sputtering, etc.). The spacer layer is subsequently etched to remove the spacer layer from horizontal surfaces, leaving the spacer layer along opposing sides of the upper electrode 420 as the sidewall spacers 422. In various embodiments, the spacer layer may comprise silicon nitride, a silicon dioxide ($SiO_2$), silicon oxy-nitride (e.g., SiON), or a similar material. In various embodiments, the spacer layer may be formed to a thickness in a range of between approximately 400 angstroms and approximately 600 angstroms.

Figure 15:
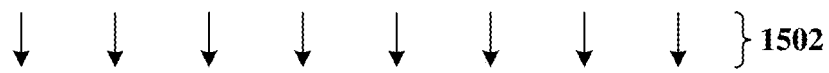
Figure 15:
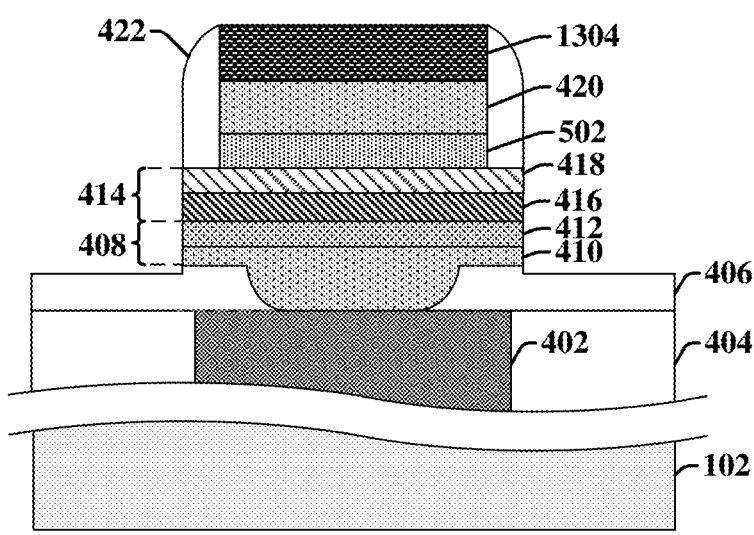

As shown in cross-sectional view 1500 of FIG. 15, a second patterning process is performed to define a multi-layer data storage structure 414 and a lower electrode 408. In some embodiments, the second patterning process selectively exposes the data storage structure (1001 of FIG. 14) and the lower electrode structure (901 of FIG. 14) to a third etchant 1502 according to a mask comprising the masking layer 1304 and the sidewall spacers 422. The third etchant 1502 is configured to remove unmasked parts of the multi-layer data storage element (1001 of FIG. 14) and the lower electrode structure (901 of FIG. 14). In various embodiments, the third etchant 1502 may comprise a dry etchant or a wet etchant.

In some embodiments, the second patterning process may reduce a thickness of unmasked regions of the lower dielectric layer 406. For example, in some embodiments, the second patterning process may reduce a thickness of the unmasked regions of the lower dielectric layer 406 by a range of between approximately 20% and approximately 35% (e.g., from approximately 270 angstroms to approximately 220 angstroms). Reducing the thickness of the unmasked regions of the lower dielectric layer 406 causes the lower dielectric layer 406 to have a greater thickness below the lower electrode 408 than outside of the lower electrode 408.

Figure 16:
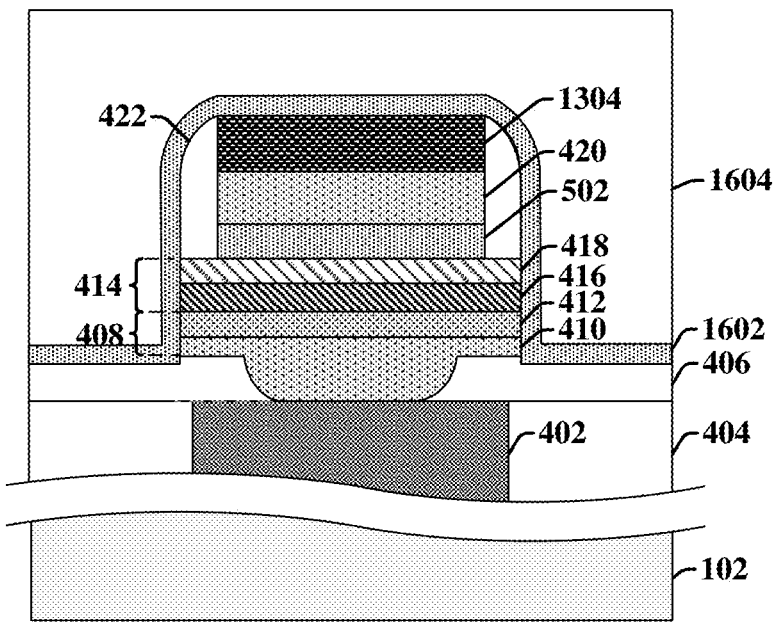

As shown in cross-sectional view 1600 of FIG. 16, an upper dielectric layer 1602 is formed over the substrate 102. An upper inter-level dielectric (ILD) layer 1604 is subsequently formed over the upper dielectric layer 1602. The upper dielectric layer 1602 has a first side that abuts the lower electrode 408, the multi-layer data storage structure 414, the sidewall spacers 422, and the masking layer 1304, and a second side that abuts the upper ILD layer 1604.

Figure 17:
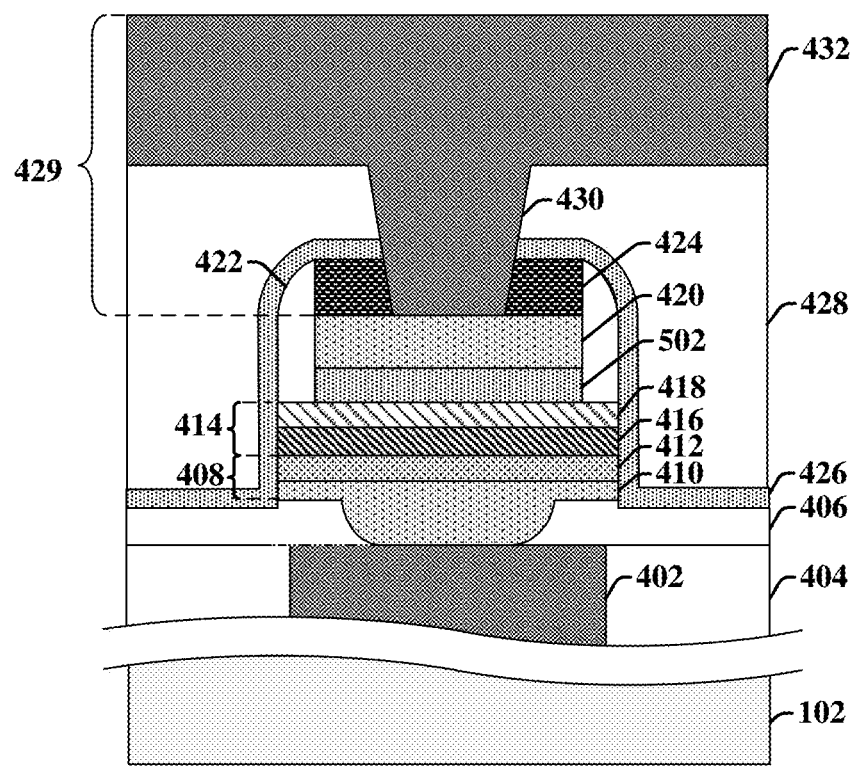

As shown in cross-sectional view 1700 of FIG. 17, an upper interconnect structure 429 is formed at a position abutting the upper electrode 420. In some embodiments, the upper interconnect structure 429 comprises an upper metal via 430 and an upper metal wire 432. In some embodiments, the upper interconnect structure 429 may be formed by etching the upper ILD layer 428 to form an opening that extends through the upper dielectric layer 426 and the masking layer 424 to the upper electrode 420. The opening is then filled with a metal (e.g., copper and/or aluminum) to form an upper metal via 430 and an upper metal wire 432.

Figure 18:
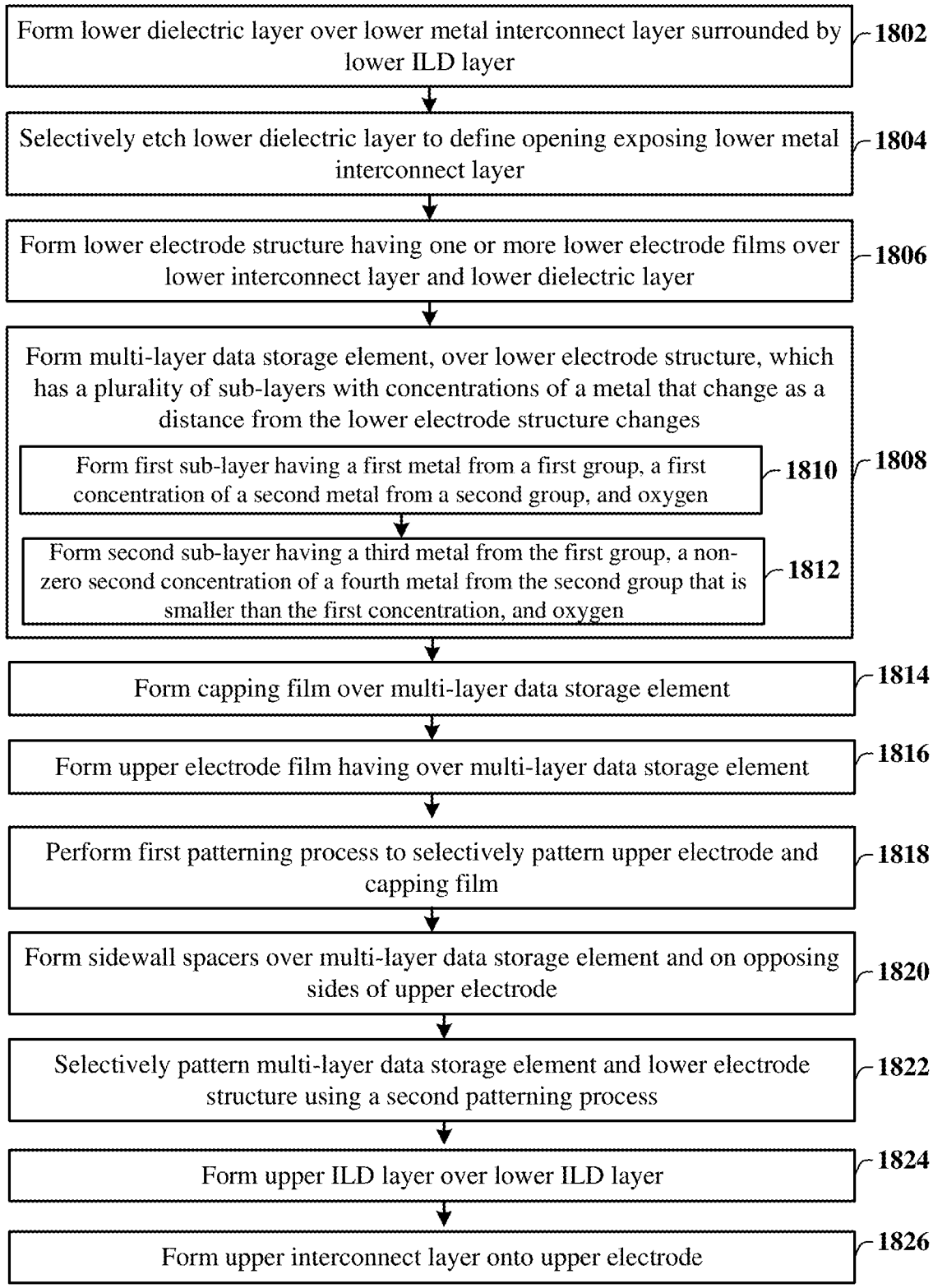
FIG. 18 illustrates a flow diagram of some embodiments of a method of forming an integrated chip comprising an RRAM device having a multi-layer data storage structure.

FIG. 18 illustrates a flow diagram of some embodiments of a method 1800 of forming an integrated chip comprising an RRAM device having a multi-layer data storage structure.

While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, a lower dielectric layer is formed over a lower interconnect layer surrounded by a lower inter-level dielectric (ILD) layer disposed over a semiconductor substrate. FIG. 7 illustrates some embodiments of a cross-sectional view 700 corresponding to act 1802.

At 1804, the lower dielectric layer is selectively etched to define an opening that extends through the lower dielectric layer to expose the lower interconnect layer. FIG. 8 illustrates some embodiments of a cross-sectional view 800 corresponding to act 1804.

At 1806, a lower electrode structure having one or more lower electrode films is formed over the lower interconnect layer and the lower dielectric layer. FIG. 9 illustrates some embodiments of a cross-sectional view 900 corresponding to act 1806.

At 1808, a multi-layer dielectric data storage element is formed over the lower electrode structure. The multi-layer dielectric data storage element comprises a plurality of sub-layers respectively having a metal from a first group of metals, a metal from a second group of metals. The plurality of sub-layers have concentrations of metal(s) from the second group of metals that change as a distance from the one or more lower electrode films changes. FIG. 10 illustrates some embodiments of a cross-sectional view 1000 corresponding to act 1808.

In some embodiments, the multi-layer dielectric data storage element may be formed according to acts 1810-1812. At 1810, a first sub-layer is formed over the one or more lower electrode films. The first sub-layer has a first metal from a first group of metals, a first concentration of a second metal from a second group of metals, and oxygen. At 1812, a second sub-layer is formed over the first sub-layer. The second sub-layer has a third metal from the first group of metals, a non-zero second concentration of a fourth metal from the second group of metals, and oxygen. The non-zero second concentration is smaller than the first concentration.

At 1814, a capping film is formed over the multi-layer dielectric data storage element, in some embodiments. FIG. 11 illustrates some embodiments of a cross-sectional view 1100 corresponding to act 1814.

At 1816, an upper electrode film is formed over the capping film. FIG. 12 illustrates some embodiments of a cross-sectional view 1200 corresponding to act 1816.

At 1818, a first patterning process is performed on the upper electrode film and the capping film. The first patterning process defines an upper electrode. FIG. 13 illustrates some embodiments of a cross-sectional view 1300 corresponding to act 1818.

At 1820, sidewall spacers are formed over the multi-layer dielectric data storage element and on opposing sides of the upper electrode. FIG. 14 illustrates some embodiments of a cross-sectional view 1400 corresponding to act 1820.

At 1822, the multi-layer dielectric data storage element and lower electrode structure are selectively patterned using a second patterning process to define a multi-layer dielectric data storage structure and a lower electrode. FIG. 15 illustrates some embodiments of a cross-sectional view 1500 corresponding to act 1822.

At 1824, an upper ILD layer is formed over the lower ILD layer. FIG. 16 illustrates some embodiments of a cross-sectional view 1600 corresponding to act 1824.

At 1826, an upper interconnect layer is formed onto the upper electrode. FIG. 17 illustrates some embodiments of a cross-sectional view 1700 corresponding to act 1826.

Therefore, the present disclosure relates to a resistive random access memory (RRAM) device having a multi-layer data storage structure configured to provide the RRAM device with a good balance RRAM endurance and data retention, and an associated method of formation.

In some embodiments, the present disclosure relates to a resistive random access memory (RRAM) device. The RRAM device includes a lower electrode over a conductive lower interconnect layer, an upper electrode over the lower electrode, and a multi-layer data storage structure between the lower electrode and the upper electrode. The multi-layer data storage structure comprises a first sub-layer and a second sub-layer. The first sub-layer has a first metal from a first group of metals, a first concentration of a second metal from a second group of metals, and oxygen. The second sub-layer has a third metal from the first group of metals, a non-zero second concentration of a fourth metal from the second group of metals, and oxygen. The non-zero second concentration is smaller than the first concentration.

In other embodiments, the present disclosure relates to a resistive random access memory (RRAM) device. The RRAM device includes a lower electrode over a lower interconnect layer surrounded by a lower inter-level dielectric (ILD) layer. An upper electrode is over the lower electrode, and a multi-layer data storage structure is between the lower electrode and the upper electrode. The multi-layer data storage structure comprises a plurality of sub-layers respectively having a metal from a first group of metals, a metal from a second group of metals having metals different than those in the first group of metals, and oxygen. A capping layer is between the upper electrode and the lower electrode. The plurality of sub-layers have concentrations of the metal from the second group of metals that decrease as a distance from the capping layer decreases.

In yet other embodiments, the present disclosure relates to a method of forming a resistive random access memory (RRAM) device. The method includes forming one or more lower electrode films over a lower interconnect layer and forming a multi-layer data storage element having a variable resistance above the one or more lower electrode films. The multi-layer data storage element comprises a plurality of sub-layers respectively having a metal from a first group of metals, a metal from a second group of metals, and oxygen. The plurality of sub-layers have concentrations of the metal from the second group of metals that change as a distance from the one or more lower electrode films changes. The method also includes forming an upper electrode film over the multi-layer data storage element. The method also includes patterning the upper electrode film to form an upper electrode, the multi-layer data storage element to form a multi-layer data storage structure, and the one or more lower electrode films to form a lower electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, although the disclosure describes the oxygen barrier layer as being within a multi-layer upper electrode, it will be appreciated that the oxygen barrier layer is not limited to the upper electrode. Rather, the oxygen barrier layer may also or alternatively be present in a multi-layer lower electrode.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a first electrode over a substrate;
a second electrode over the substrate; and
a data storage structure disposed between the first electrode and the second electrode, wherein the data storage structure comprises one or more metals having non-zero concentrations that change as a distance from the substrate increases.

2. The memory device of claim 1, wherein the one or more metals comprise one of aluminum, tantalum, and lanthanum.

3. The memory device of claim 1, wherein the non-zero concentrations of the one or more metals are defined by one or more continuous functions extending between a bottom surface of the data storage structure and a top surface of the data storage structure.

4. The memory device of claim 1, wherein the non-zero concentrations of the one or more metals have a highest concentration at a position that is above a bottom surface of the data storage structure and below a top surface of the data storage structure.

5. The memory device of claim 1, wherein the data storage structure comprises a first metal, a second metal, and oxygen.

6. The memory device of claim 5, wherein the second metal has a first concentration along a bottom surface of the data storage structure and a second concentration along a top surface of the data storage structure, the second concentration less than the first concentration.

7. The memory device of claim 1, wherein the one or more metals comprise a first metal that has a concentration that increases between a bottom surface of the data storage structure and a first height over the bottom surface and that decreases from the first height to a second height over the bottom surface.

8. A memory device, comprising:
a first electrode over a substrate;
a second electrode over the substrate; and
a data storage structure disposed between the first electrode and the second electrode, wherein the data storage structure comprises a first non-zero concentration of a metal along a bottom surface of the data storage structure and a second non-zero concentration of the metal at a point over the bottom surface, the first non-zero concentration different than the second non-zero concentration.

9. The memory device of claim 8, wherein a top surface of the data storage structure comprises a first material and the bottom surface of the data storage structure comprises a second material that is different than the first material.

10. The memory device of claim 8, wherein the data storage structure comprises a first layer comprising a first plurality of elements and a second layer comprising a second plurality of elements.

11. The memory device of claim 10,
wherein the first plurality of elements comprises a first metal from a first group of metals and a second metal from a second group of metals; and
wherein the second plurality of elements comprises a third metal from the first group of metals and a fourth metal from the second group of metals.

12. The memory device of claim 11, wherein the first metal and the third metal are a same metal.

13. The memory device of claim 11,
wherein the first group of metals consist of titanium, hafnium, and zirconium; and
wherein the second group of metals consists of aluminum, tantalum, and lanthanum.

14. The memory device of claim 11,
wherein the first metal has a concentration that is in a first range of between approximately 50% and approximately 100%; and
wherein the third metal has a second concentration that is in a second range of between approximately 30% and approximately 60%.

15. The memory device of claim 14, further comprising:
a capping layer disposed between the first electrode and the second electrode, wherein the capping layer is closer to the third metal than to the first metal.

16. The memory device of claim 8, wherein a density of oxygen vacancies within the data storage structure changes as a distance from the bottom surface of the data storage structure changes.

17. A method of forming a memory device, comprising:
depositing a lower electrode structure over a substrate;
forming a data storage element comprising one or more metals having non-zero concentrations that change as a distance from the lower electrode structure increases;
depositing an upper electrode structure over the data storage element; and
removing parts of the upper electrode structure, the data storage element, and the lower electrode structure to define a data storage structure between a lower electrode and an upper electrode.

18. The method of claim 17, wherein forming the data storage element comprises:
forming a first sub-layer comprising a first plurality of elements, wherein the first plurality of elements comprises a first metal from a first group of metals and a second metal from a second group of metals; and
forming a second sub-layer comprising a second plurality of elements, wherein the second plurality of elements comprises a third metal from the first group of metals and a fourth metal from the second group of metals.

19. The method of claim 18,
wherein the first group of metals consist of titanium, hafnium, and zirconium; and
wherein the second group of metals consists of aluminum, tantalum, and lanthanum.

20. The method of claim 18, wherein the one or more metals comprise a plurality of metals.

* * * * *